(12) United States Patent
Lovell et al.

(10) Patent No.: US 10,014,872 B2
(45) Date of Patent: Jul. 3, 2018

(54) UNIVERSAL INPUT AND OUTPUT INTERFACE

(71) Applicant: General Electric Company, Schenectady, NY (US)

(72) Inventors: Alan Carroll Lovell, Roanoke, VA (US); Bruce Henderson, Salem, VA (US)

(73) Assignee: GE INTELLIGENT PLATFORMS, INC., Charlottesville, VA (US)

( * ) Notice: Subject to any disclaimer, the term of this patent is extended or adjusted under 35 U.S.C. 154(b) by 0 days.

(21) Appl. No.: 15/532,675

(22) PCT Filed: Dec. 3, 2014

(86) PCT No.: PCT/US2014/068302
§ 371 (c)(1),
(2) Date: Jun. 2, 2017

(87) PCT Pub. No.: WO2016/089384
PCT Pub. Date: Jun. 9, 2016

(65) Prior Publication Data
US 2017/0366196 A1  Dec. 21, 2017

(51) Int. Cl.
*H03M 1/02* (2006.01)
*H03M 1/00* (2006.01)
(Continued)

(52) U.S. Cl.
CPC .............. *H03M 1/004* (2013.01); *H03C 3/00* (2013.01); *G01K 7/021* (2013.01); *G01K 7/16* (2013.01)

(58) Field of Classification Search
CPC .......... H03M 3/464; H03M 3/00; H03M 1/66; H03M 1/747
(Continued)

(56) References Cited

U.S. PATENT DOCUMENTS 7,372,914 B2  5/2008  Calvin
8,073,991 B2  12/2011 Alley et al.
(Continued)

FOREIGN PATENT DOCUMENTS

WO   2016/032477 A1   3/2016
WO   2016/032479 A1   3/2016

OTHER PUBLICATIONS

International Search Report and Written Opinion issued in connection with corresponding PCT Application No. PCT/US2014/068302 dated Mar. 20, 2015.

*Primary Examiner* — Jean B Jeanglaude
(74) *Attorney, Agent, or Firm* — GE Global Patent Operation; Scott R. Stanley

(57) ABSTRACT

Provided is programmable circuit for interfacing with a field device. The circuit includes only one analog-to-digital converter (ADC) configured to receive from the field device one from the group including a current signal and a voltage signal. The received one signal has frequency shift keying tones (FSK) superimposed thereon, the ADC being configured to extract information from the received one signal and the FSK tones simultaneously. Also included is only one digital-to-analog converter configured to drive an output signal to the field device, the output signal (i) including one from the group including a current signal and a voltage signal and (ii) being summed with an FSK-modulated signal.

7 Claims, 6 Drawing Sheets

(51) Int. Cl.
  *H03C 3/00* (2006.01)
  *G01K 7/16* (2006.01)
  *G01K 7/02* (2006.01)

(58) Field of Classification Search
  USPC .......................................... 341/108, 155, 144
  See application file for complete search history.

(56) References Cited

U.S. PATENT DOCUMENTS

| | | |
|---|---|---|
| 8,373,586 B2 | 2/2013 | Alley et al. |
| 8,514,964 B2 | 8/2013 | Calvin |
| 8,656,065 B1 * | 2/2014 | Gerhart ................ G06F 13/385 |
| | | 370/236 |
| 2008/0126665 A1 * | 5/2008 | Burr .................... G05B 19/042 |
| | | 710/316 |
| 2011/0227773 A1 | 9/2011 | Alley |
| 2012/0020430 A1 * | 1/2012 | Haase .................. H03M 3/438 |
| | | 375/295 |
| 2012/0253481 A1 | 10/2012 | Alley et al. |
| 2014/0047137 A1 | 2/2014 | Mathason et al. |

* cited by examiner

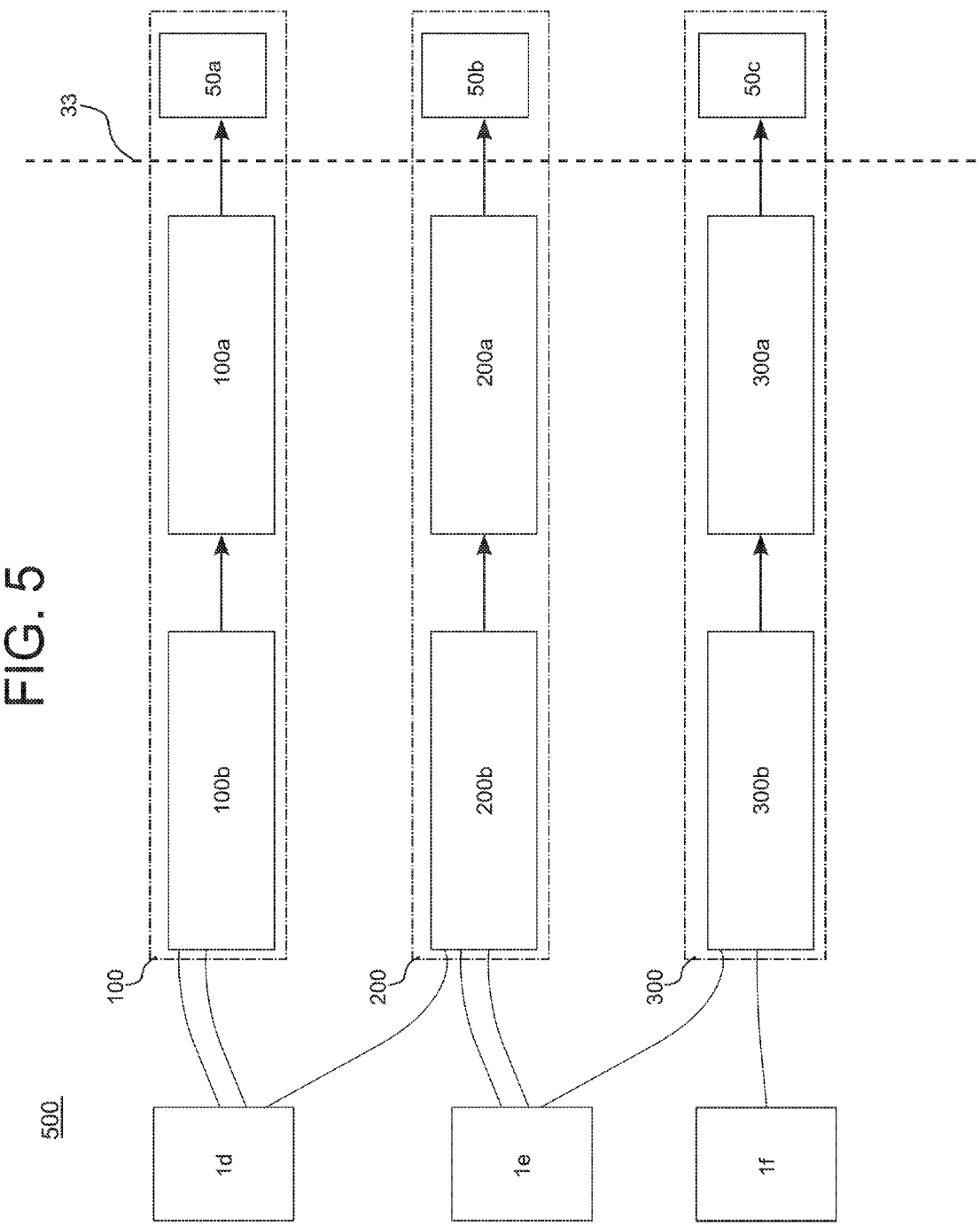

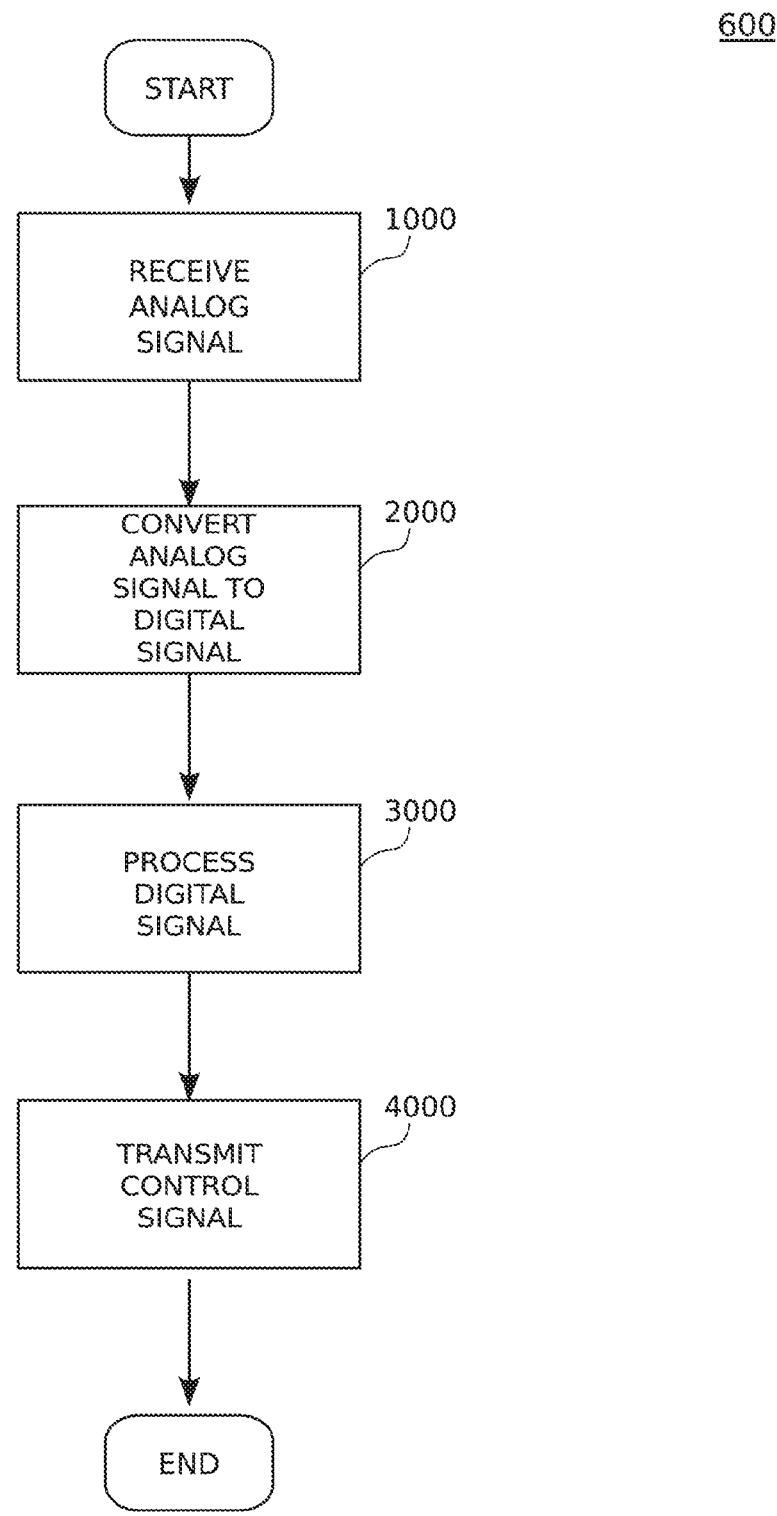

UNIVERSAL INPUT AND OUTPUT INTERFACE

TECHNICAL FIELD

The present disclosure generally relates to communication between devices. More particularly, the present disclosure relates to an interface for communication between a field device and a control or host device.

BACKGROUND

Industrial control systems and distributed control systems (DCS) interface with a variety of field (or input) devices. From a control or host device perspective, input devices (e.g. as transducers and sensors) are devices that transmit signals to the control or host device. On the other hand, output devices, such as actuators, coils, and solenoids receive signals from control or host devices. Field devices may transmit or receive signals to and from control devices using two, sometimes three or four wires. They may transmit or receive analog or digital signals in the form of discrete levels, analog signals, or modulated signals, such as frequency shift keyed (FSK) modulated signals. The FSK signals are modulated according to the Highway Addressable Remote Transducer (HART) communication protocol.

In practical applications, large numbers of field devices have a variety of architectures. Historically, to interface with such a large number of disparate field devices, an equally large number of I/O modules was required.

SUMMARY OF THE INVENTION

In one illustrative embodiment, the present disclosure provides is a programmable circuit for interfacing with a field device. The circuit includes only one analog-to-digital converter (ADC) configured to receive from the field device one from the group including a current signal and a voltage signal The received one signal has frequency shift keying tones (FSK) superimposed thereon, the ADC being configured to extract information from the received one signal and the FSK tones simultaneously. Also included is only one digital-to-analog converter configured to drive an output signal to the field device, the output signal (i) including one from the group including a current signal and a voltage signal and (ii) being summed with an FSK-modulated signal.

Additional features, advantages, as well as the structure and operation of various embodiments are described in detail below with reference to the accompanying drawings. It is noted that the disclosure is not limited to the specific embodiments described herein. The embodiments are presented for illustrative purposes only. Additional embodiments will be readily apparent to persons skilled in the relevant art(s) based on the teachings of the present disclosure.

BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various figures. The drawings are only for purposes of illustrating the embodiments and are not to be construed as limiting the disclosure. Therefore, given the following enabling description of the drawings, the novel aspects of the present disclosure should become evident to a person of ordinary skill in the relevant art(s).

FIG. 5 illustrates a distributed control system according to an illustrative embodiment.

FIG. 6 illustrates a method for providing an interface between a field device and a host device according to an illustrative embodiment.

DETAILED DESCRIPTION OF THE INVENTION

Figure 1:
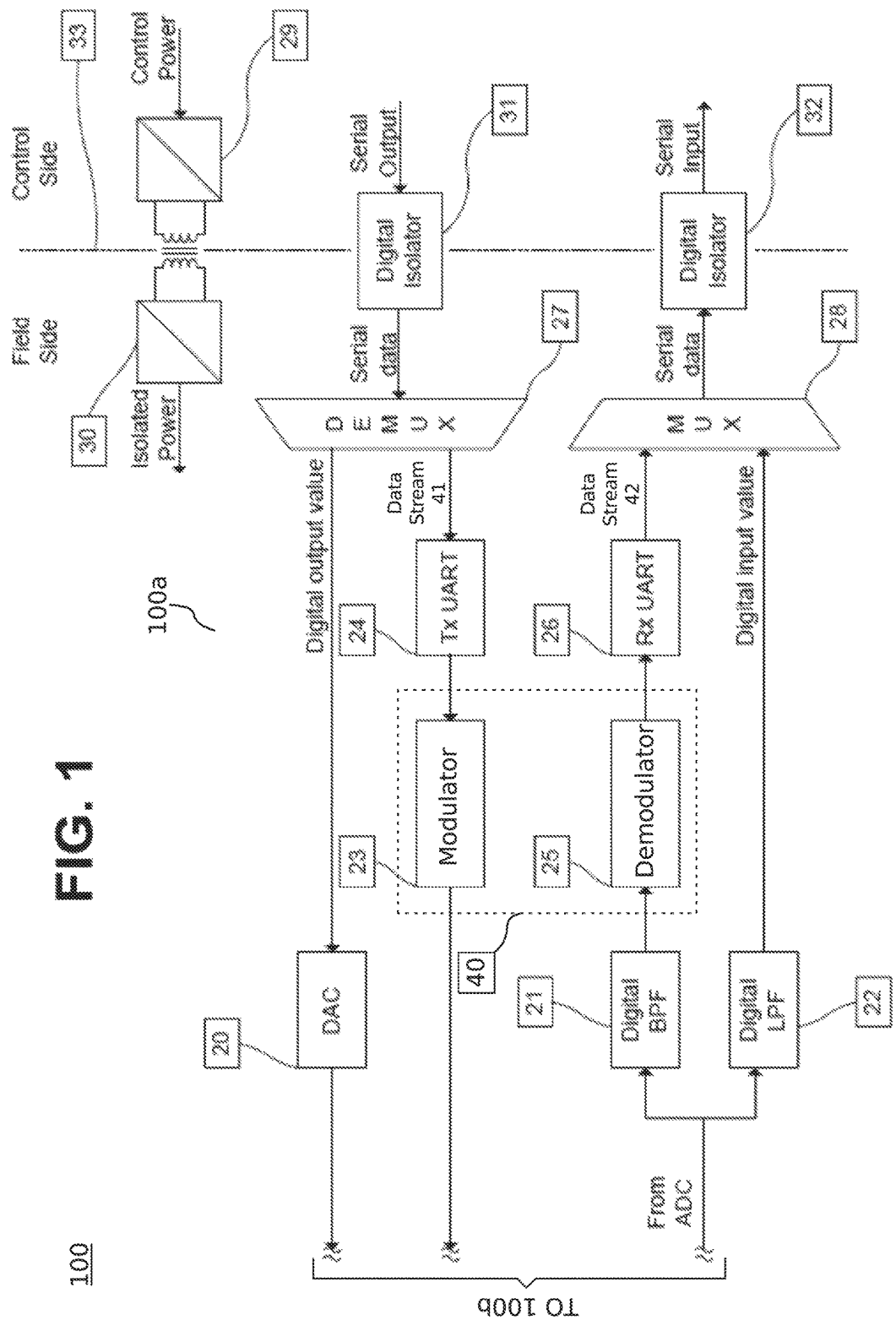
FIG. 1 is a diagram of a section of an interface device according to an illustrative embodiment.

While illustrative embodiments are described herein for particular applications, it should be understood that the present disclosure is not limited thereto. Those skilled in the relevant art(s) with access to the teachings provided herein will recognize additional modifications, applications, and embodiments within the scope thereof and additional fields in which the present disclosure may be of significant utility.

In some applications, DCS cabinets may contain a variety of I/O acquisition modules for interfacing with a variety of field devices. Historically, each module was optimized for a unique purpose: modules were either for output modes, or they were for input modes. And each module was either analog or digital.

The embodiments disclosed herein allow a single module to interface with all the common I/O types without manual switches or jumpers. A DCS may be built with two or more interface devices, according to exemplary embodiments of the present disclosure. In such a DCS, wiring may terminate directly into a DCS cabinet instead of first routing wires to a scatter-gather marshaling cabinet, as was typically done in the related art. Universal I/O platforms according to the present disclosure allow mixed I/O types to connect directly to the DCS terminals. The I/O platforms can be programmed to match landed field wiring. I/O types can be changed at any time to match requirements.

The embodiments provide lower risk of component obsolescence for key parts such as a HART modem or specialized op-amps. Further, the embodiments provide I/O functionally with a reduced number of parts. As such, fewer parts may be needed in inventory for industrial DCS applications, thus minimizing unused I/O modules and thereby leading to increased savings.

Furthermore, the embodiments provide diagnostics functionalities unparalleled in the related art since the same hardware used for input modes be used to verify output modes. The embodiments also facilitate deferring the decision of types of I/O interfaces needed since a desired I/O mode can simply be programmed using the same hardware.

Further, in practical applications, typical I/O systems may connect to a few thousands of field devices. In these situations, personnel often do not know a priori the breakdown of quantities of each type of sensors (or actuators) included in the few thousands of field devices. To circumvent this issue, extra I/O modules were included for each type of field device anticipated, each I/O module being dedicated solely to one type of sensor. This approach created increased deployment costs as well as increased complexity in measurement.

The embodiments disclosed herein reduce costs and I/O system complexity by including channels programmable for any type of field device having wires routed to a programmable channel. In embodiments of the present disclosure, swapping a module of one type for another is not required. As a consequence, associated labor costs required to initiate engineering change orders are eliminated, as well as requirement to move wires from one set of termination points to another are required. That is, all channels of the disclosed universal I/O device are reprogrammable to support a new sensor type.

Furthermore, the presently disclosed embodiments include a single analog-to-digital converter and a single digital-to-analog converter, which simplifies the I/O marshalling (i.e. the reprogramming of an I/O channel to support a specific field device).

In an embodiment, a programmable interface is provided to accommodate different types of input and output devices (I/O modes). The interface is compatible with signals common in industrial I/O and DCS applications. For example, the supported modes include, but are not limited to, analog voltage input, analog current input, discrete contact (voltage) input, and discrete current input, HART.

The supported modules also include current output, voltage output, combined current output and voltage input (RTD and thermo-couple measurements), relay output, and 24V digital inputs and outputs. Additionally, the interface provides galvanic isolation to isolate the control from the field wiring, and is implementable from commercially available integrated circuits or from application specific circuits (ASICs). As such, the interface can be considered a universal I/O interface.

For ease of understanding the operation and structure of the illustrative embodiments discussed herein, the terms "input" and "input signals" are used to refer to signals flowing from the "Field Side" to the "Control Side" of FIG. 1. Conversely, the terms "output" and "output signals" are used to refer to signals flowing from the "Control Side" to the "Field Side" of FIG. 1. Nevertheless, one of skill in the art will readily understand that the meanings assigned to these terms are by convention only and that a convention other than the one used herein may be adopted without departing from the scope of the present disclosure. Furthermore, input and output signals may include one or more signal components.

A signal component may be, for example, a 4-20 milliamp current signal, a 0-5 Volt unipolar signal, a 0-10 Volt unipolar signal, a +/−5 Volt bipolar, or a +/−10 Volt bipolar voltage signal. These signal components may be non-modulated signals. Another signal component may be a modulated signal, namely a FSK-modulated signal, such as a HART signal. The input signals may originate from field devices such as resistance temperature detectors (RTD), and thermocouples. It is noted that other field devices are contemplated. As such, generally speaking, in the present disclosure, a field device may be any device that may be communicatively coupled to a field circuit according to the exemplary embodiments.

Figure 2:
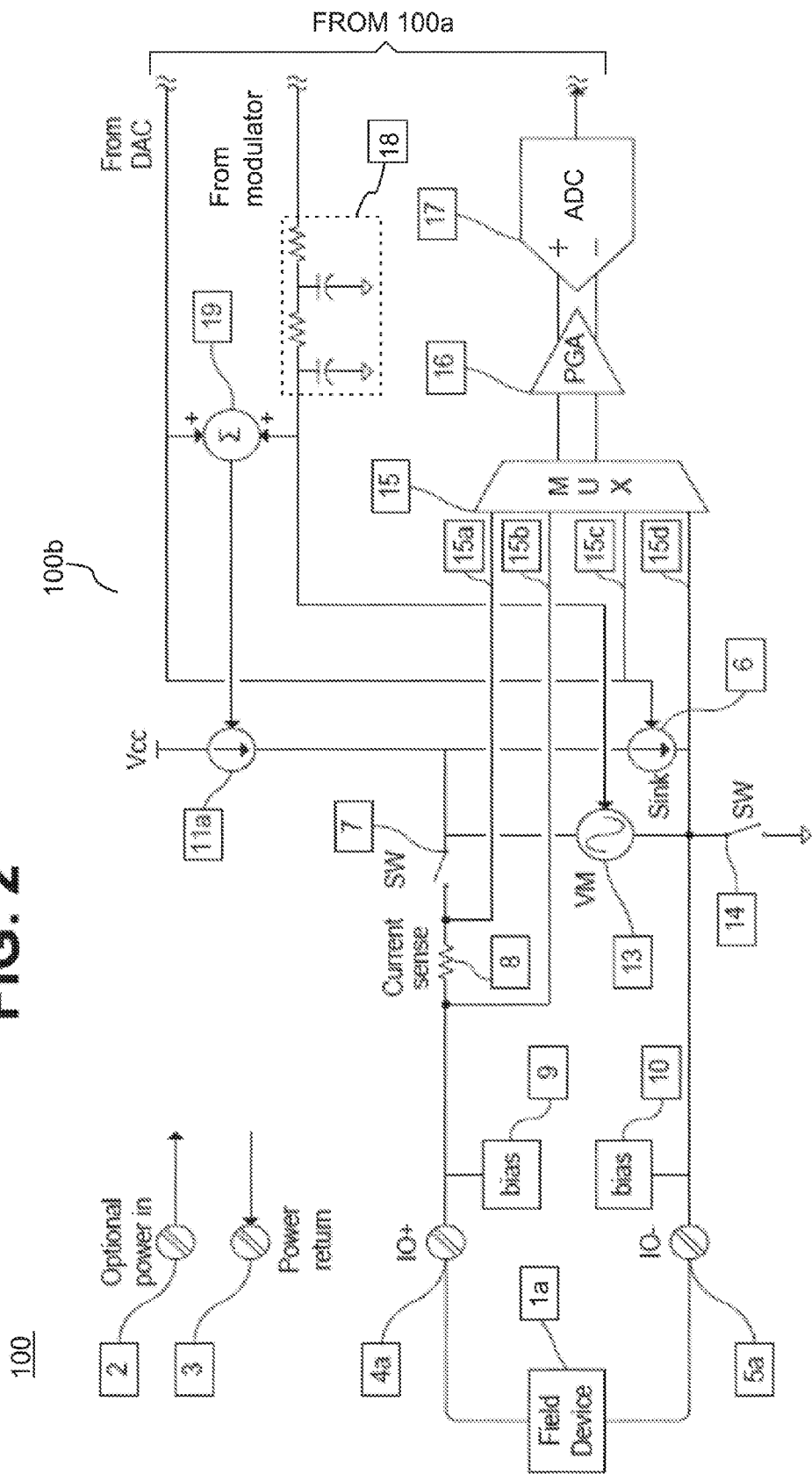
FIG. 2 is a diagram of another section of the interface device according to an illustrative embodiment.

FIG. 1 and FIG. 2 illustrate two sections (100a and 100b) of an interface device 100, according to an illustrative embodiment. FIG. 1 illustrates a first section 100a. Interface device 100 may include a programmable logic device (PLD). The dashed line represents an isolation boundary 33 that divides the circuits of the field (i.e. on the "Field Side" of FIG. 1 and in FIG. 2) from the circuits of the controller/processor (i.e. on the "Control Side" of FIG. 1) and, possibly, from other instances (not shown) of circuits on the field side. First section 100a may be a control circuit that interfaces with controllers or devices on the control side of boundary 33. On the other hand, second section 100b may be a field circuit that interfaces with field devices on the field side of boundary 33.

Boundary 33 may or may not provide galvanic isolation, depending on the control needs dictated by the application at hand. In some embodiments, boundary 33 may be programmable to implement isolated or non-isolated channels for devices connected thereto. Further, Boundary 33 may include a power supply 30 implemented using a transformer having its windings disposed on each side of isolation boundary 33.

Power supply 30 may be used to provide an isolated power supply to circuits on the field side, the power being derived from a control power supply 29 disposed on the control side. Furthermore, boundary 33 may include digital isolators 31 and 32 whose functions are to provide isolated channels for transferring input and output serial data from either side of boundary 33. Generally speaking, boundary 33 may include a plurality of isolation barriers. Furthermore, one of skill in the art will readily understand that in some embodiments of the present disclosure, serial data originating from either side of boundary 33 may be transferred without passing through digital isolators 31 or 32; for example, this may be accomplished with digital switches that may be programmed to bypass digital isolators 31 and 32.

Still referring to FIG. 1, elements 20-28 constitute a first portion of a PLD, the second portion being programmable circuits and elements shown in FIG. 2. The first portion of the PLD includes a digital-to-analog converter 20 (DAC), a band pass filter (BPF) 21, a low pass filter (22), a multiplexer (MUX) 28, a de-multiplexer (DEMUX) 27, a modulator 23, a demodulator 25, and a transmitter that may be implemented using a Universal Asynchronous Receiver Transmitter (UART) circuit (denoted Tx UART 24). Further, the first portion of the PLD may include a receiver implemented using a UART circuit (denoted Rx UART 25). Data streams 41 and 42 may be HART signals in some embodiments, modulator 23 and demodulator 25 may be configured to perform other types of FSK-based modulation protocols. Furthermore, while modulator 23 and modulator 25 are shown as discrete blocks, they may be implemented using a single component, such as a modem 40.

The first portion of the PLD has primary functions indicated by elements 20-28. However, the first portion of the PLD, or the PLD as a whole, may have additional functionality that is not shown in FIG. 1 or in FIG. 2. Such additional functionality may be, for instance, clock generation and configuration settings for de-multiplexing and multiplexing data.

Configuring the PLD may involve programming elements such as switches 7 or 14 (in FIG. 2) or switches that may be internal to the various elements of FIG. 1 and FIG. 2, adjusting the gain of a programmable gain amplifier (PGA) (element 16 in FIG. 2), selecting a mode of operation for DAC 20 (FIG. 1), and selecting a mode of operation for an analog to digital converter (ADC) (element 17 in FIG. 2).

Referring now to FIG. 2, which illustrates a second section 100b of interface device 100, field device 1a connects to terminals 4a and 5a to interface with interface device 100. In addition to terminals 4a and 5a, second section 100b includes optional power pin 2, power return pin 3, biases 9 and 10, current sense resistor 8, voltage modulator (VM) 13, switches 7 and 14, current sink 6, inputs 15a, 15b, 15c, and 15d of multiplexer (MUX) 15, PGA 16, ADC 17, low pass filter (LPF) 18, and summing junction 19. ADC 17 may be implemented as a sigma-delta (ΣΔ) ADC, but other architectures known in the art are also contemplated. These other architectures may be, for example, flash ADC architectures and the like or dual-slope converter architectures and the like.

Figure 3:
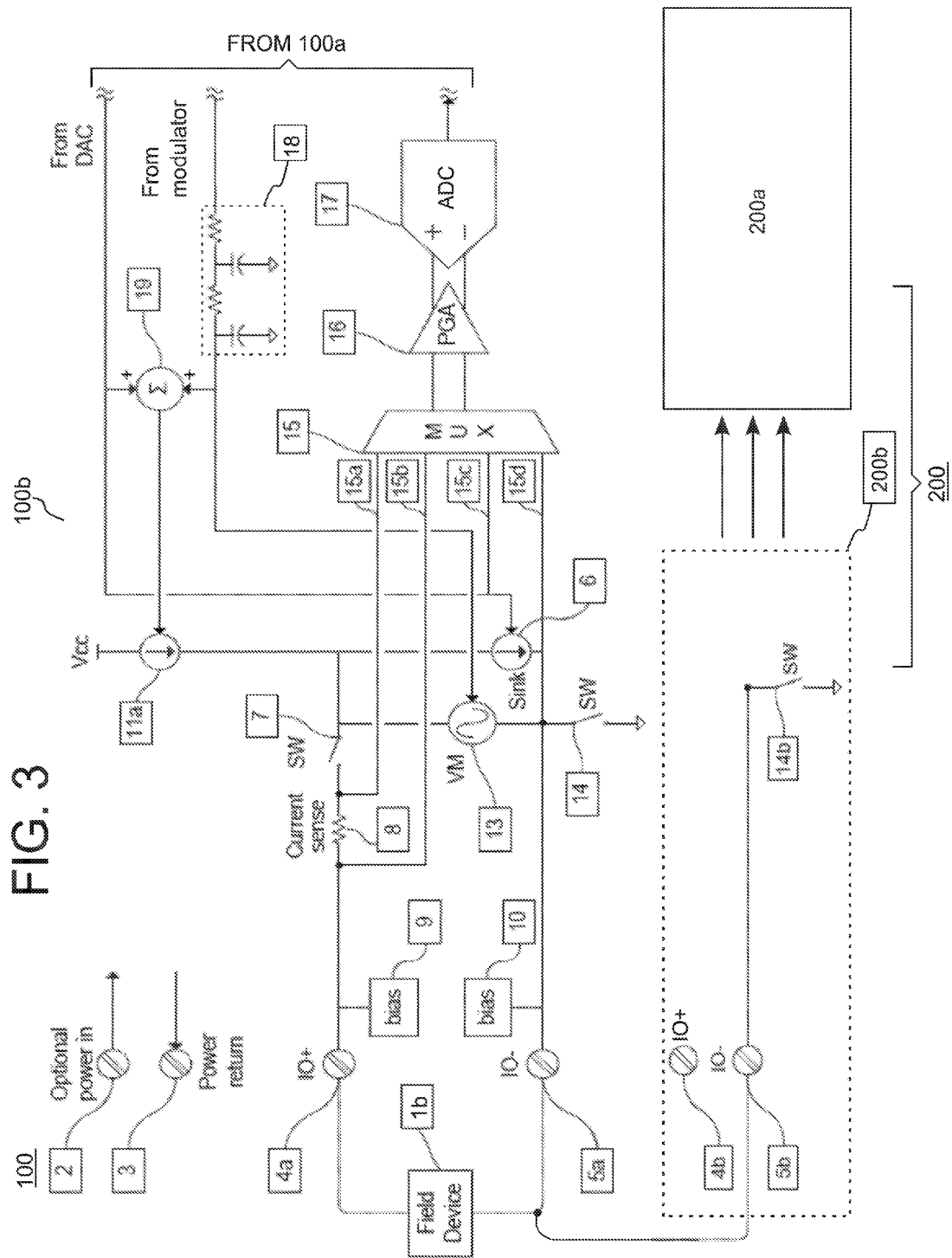
FIG. 3 illustrates an interface device configured to interface with one type of field device according to an illustrative embodiment.
Figure 4:
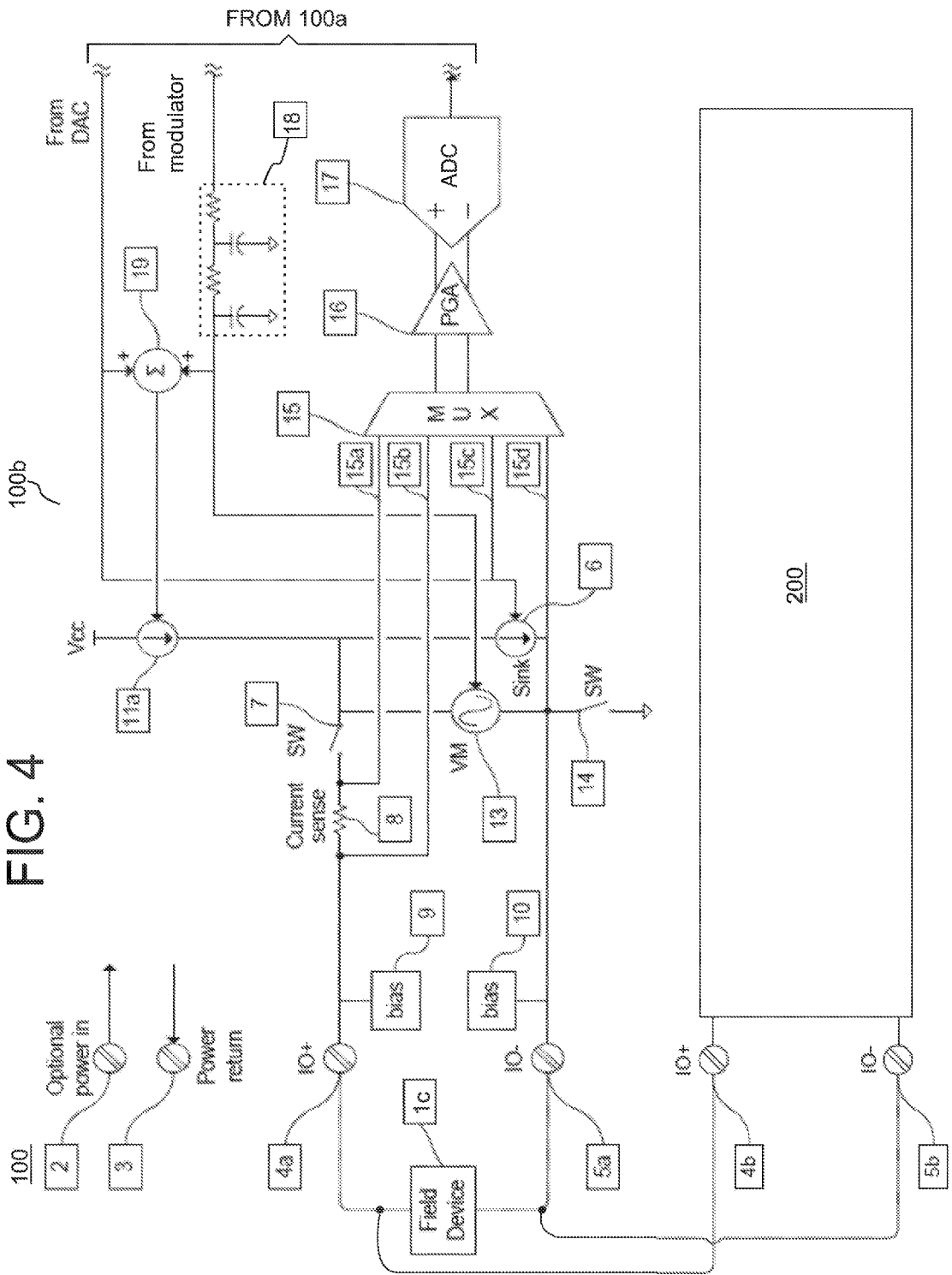
FIG. 4 illustrates an interface device configured to interface with another type of field device according to an illustrative embodiment.

FIG. 3 and FIG. 4, respectively, illustrate interface devices 100 and 200 being configured to interface with a three-wire resistor temperature detector (RTD) denoted "field device 1b" (FIG. 3) and with a four-wire RTD denoted "field device 1c," (FIG. 4). Interface device 200, while not shown in its entirety, is an instance of interface device 100. An instance of a first circuit may be defined herein as another circuit that has substantially similar architecture as the first circuit. The instance of the first circuit may include at least the same hardware or equivalent hardware necessary to provide all the functionality of the first circuit. One of ordinary skill in the relevant art(s) will readily understand that the instance of the first circuit and the first circuit itself may or may not be programmed or implemented differently, depending on the application at hand.

As such, FIG. 3 illustrates an instance of first section 100a and an instance of second section 100b. Namely, a first section 200a similar in architecture to first section 100a and a section 200b similar in architecture to section 100b, of which terminals 4b and 5b are shown. Referring now to FIG. 4, field device 1c is connected to terminals 4a, 5a, 4b, and 5b, effectively interfacing field device 1c with interface devices 100 and 200.

In FIG. 2 and FIG. 3, field device connections may be made at terminals 2, 3, 4a, 5a, 4b, and 5b. In FIG. 2, terminals 4a and 5a are the primary connection points for most field device types that may use two-wire signaling. In FIG. 3, terminal 5b is a secondary connection point for a field device that uses three-wire signaling. Such device may be, for example, a three-wire RTD, and it may be shared between interface device 100 and interface device 200. In FIG. 4, terminals 4b and 5b are secondary connection points for four-wire signaling field device, such as a four-wire signaling RTD. Terminals 4a and 5a are the minimum set of terminals required to connect to many types of field devices with an interface device, according to exemplary embodiments. Terminals 2 and 3 may be configured to supply power to interface device 100 from the field side rather than from the control side using power supplies 29 and 30.

Signal conditioning components, such as transient suppressors, resistors, and capacitors, inductors, and ferrites may be inserted between the field terminals and the input/output circuitry of the interface device 100. One of skill in the art will readily recognize that such conditioning components may or may not be included in the interface devices or their instances, depending on constraints dictated by the application at hand.

Turning now to FIG. 1 and FIG. 2, a description of the flow of output signals through interface device 100 is provided. Power supply 30 provides bulk power to generate all the necessary supplies for the circuit elements included in first section 100a and second section 100b. In some embodiments, bulk power may be provided from the control side utilizing power supply 30 to generate the supplies. The generated supplies may include bipolar analog rails (example +15V, −15V), low voltage analog supply (example 5V), and digital supplies as needed (for example, 3.3V, 2.5V, 1.2V, 1V).

Digital isolator 31 may repeat data bits to the field side DEMUX 27. Isolator 31 may be one of an opto-coupler, inductive coupler, capacitive coupler, and RF coupler. The bandwidth of the channel set by isolator 31 may be at least 10M bits/sec.

DEMUX 27 may be configured to separate one time-multiplexed digital channel into data including data stream 41 and a digital output value datastream, so that only one isolator channel (isolator 31) may be used. Data stream 41 is routed to modulator 23 via Tx UART 24. In some embodiments, the modulator 23 may be configured to modulate the incoming signal using an FSK protocol or a HART protocol.

The implementation of elements 20-28 may be spread across one or more PLD devices. In some embodiments, these elements and first section 100a altogether may be located partly within the control side of isolators (or non-isolated channels) 31 and 32, and partly within the field side of boundary 33. These design choices may be made based upon PLD resources which may already be present at the control side and based other factors such as the number of universal I/O points within the field side and whether the I/O points require point-to-point isolation or group isolation.

In some embodiments, modem 40 may be a commercially-available modem. In other embodiments, however, modem 40 may be implemented in a PLD. The advantage of implementing the modem in a PLD, rather than using commercially-available module, is that the PLD is already present in the interface device, thus allowing an implementation that utilizes a reduced number of components.

The Tx UART 24 transmitter may be implemented using a PLD or an ASIC). Transmitter Tx UART 24 may be located on either side of boundary 33. The purpose of the Tx UART 24 is to receive data at one rate from the controller and dispense it one bit at a time to modulator 23, which may be configured to convert a binary 0 or 1 to an FSK encoded signal. Modulator 23 converts the FSK signal into a stream of pulses which is routed to second section 100b and filtered using low-pass filter 18 located therein (see FIG. 2).

Digital to analog converter (DAC) 20 receives a binary data word from DEMUX 27, and converts it linearly to a voltage, and buffers the voltage. The buffered voltage may be driven out directly, or converted to a current output and fed to second section 100b. The choice of voltage or current output may be made using a control word included in the multiplexed data prior to de-multiplexing. The control word may be altered by programming a controller that issues the signal from the control side.

In FIG. 2, while low pass filter 18 is shown as a set of passive components, it may be implemented with active components, and its transfer characteristics may be programmed digitally. The low pass filter 18 removes the intermediate frequency (IF) introduced by modulator 23 during modulation. However, at the output of low pass filter 18, the FSK tones are preserved.

A summing junction 19 may be used to superimpose the previously described FSK tones upon the voltage generated by DAC 20. In some embodiments, summing junction 19 may be implemented using a summing operational amplifier circuit.

Voltage to current source 11a linearly translates the summed voltage to a current. The translation may be provided by a linear pass transistor, for example. In alternate embodiments, the translation from voltage to current may be implemented using a buck or a boost regulator.

While elements 11a, 19, and 20 are shown in FIGS. 1 and 2 as discrete blocks, they may be integrated into a single IC.

For example, these elements may be found pre-packaged into presently available commercial DACs.

When interface device 100 is programmed for output mode, the current or voltage output by DAC 20 is present at current sense resistor 8 and at terminal 4a, with a current return or voltage reference at terminal 5a. As such, this current (the current at current sense resistor 8) is an output signal, and it is transmitted to field device 1a via a field loop connected to field device 1a. For output mode programming, switch 14 is closed to provide a return current path for the output signal.

When interface device 100 is programmed for input mode, the current and voltage outputs of DAC 20 may be isolated from second section 100b to prevent current leakage corruption of any input signal. Isolation may be provided using switches disposed between first section 100a and second section 100b (not shown in FIGS. 1 and 2). In some embodiments, the switches may be implemented using discrete components. In other embodiments, they may be contained in an IC that includes DAC 20.

In case of disconnected, broken, or missing field wiring connections, open wire bias supplies 9, 10 in FIG. 2 ensure detection of the condition, and provide a DC path to ground, thereby providing a high input impedance to PGA 16.

In FIG. 2, field device 1a may direct a current into terminal 4a, current sense resistor 8, and voltage modulator (VM) 13 (described below); the current is returned to field device 1a through terminal 5a. The current signal may contain FSK current signals that comply with a HART protocol, in addition to a standard 4-20 mA current, which is a process current. The process signal current component and the FSK components are preserved throughout the subsequent elements of second section 100b. The spectra of the two current components may be extracted, and the two current components may be further conditioned and transmitted to the control side, as described later.

In FIG. 2, VM 13 may be used to provide a loading impedance for the input current signal when interface device 100 is programmed for 4-20 mA current input mode. The impedance of VM 13 converts current from field device 1a into a measureable voltage signal. Simultaneously, VM 13 may receive a reference signal from low pass filter 18, and VM 13 may apply gain or attenuation, buffer, and finally superimpose the buffered voltage across its own two signal ports. The buffered voltage signal is present on inputs 15a-15d of MUX 15. The buffered voltage signal may also be impressed across terminals 4a and 5a so that it may also be sensed by field device 1a.

The input current signal develops a voltage across current sense resistor 8. This "sensed" voltage is thus present at inputs 15a-15d of MUX 15. As such, the process current signal and the FSK signal are present at the input terminals of MUX 15. Furthermore, MUX 15 may be configured to select either a bidirectional current measurement using input terminals 15a, 15b, 15c, and 15d or it may be configured to select the bipolar voltage signal. In either case, it directs the desired signal to PGA 16.

Embodiments of the present disclosure may allow programmable I/O modes that select between current or voltage measurements or that time-multiplex both measurements. Thus, one type of signal (current or voltage) may be observed continuously, or both signals may be observed in alternating periods of time.

The PGA 16 attenuates or amplifies a received input signal. PGA 16 may be configured to remove a common mode of the signal and can buffer the processed input signal before outputting it to ADC 17. PGA 16 has sufficient bandwidth to preserve the integrity the input signal. Specifically, the bandwidth of the PGA 16 can range from DC up to the bandwidth of the FSK signals contained in the input signal, wherein the bandwidth of the FSK signals is specified by the HART protocol.

The PGA 16 output drives the input of the ADC 17, which may be a $\Sigma\Delta$ type ADC, with a continuously sampling front-end. As mentioned previously, the present disclosure is not limited to the $\Sigma\Delta$ architecture. ADC 17 may provide a single bit output or a pre-filtered output. In the latter case, the ADC 17 filter's output rate must be much higher (10 times greater) than the bandwidth of the FSK signals of interest.

The digital output of ADC 17 (FIG. 3) is directed to the digital BPF 21 and LPF 22 (FIG. 1). The output of LPF 22 output is further processed by demodulator 25 whose output is fed to a UART receiver denoted Rx UART 26 (see modem 40 in FIG. 1). The Rx UART 26 receiver functions similarly to the Tx UART 24 transmitter. The filtered paths are combined by MUX 28 to produce serial data that are directed to digital isolator 32. Taken together, BPF 21, LPF 22, demodulator 25, and Rx UART 26 form a processing circuit that is configured to split the converted signal at the output of AD17 in two signal paths, namely data stream 42 and the digital input value, which are both inputted to MUX 28.

Digital isolator 32 is a single channel which complements digital isolator 31 by transmitting binary encoded data from the field side to the control side. In other words, isolator 32 receives data from MUX 28 and repeats the data bits to the control side. Isolator 32 may be one of an opto-coupler, inductive coupler, capacitive coupler, and a RF coupler. The bandwidth of the channel is on the order of 10M bits/sec or greater.

As can be seen from the previous discussion, the input path, i.e. the field side circuits, may be used to measure output signals when the programmable I/O circuit is in an output mode, in addition to providing input signal measurement and processing functionality.

FIG. 1 and FIG. 2 have been generally described thus far to illustrate input signal and output signal processing and measurement functionalities of interface device 100. FIGS. 1, 2, 3, and 4 will now be discussed to illustrate how interface devices according to the present disclosure may be programmed in various I/O modes to support different types of field devices. Namely, in various embodiments, interface devices 100 and 200 may be configured to support field devices operating in various and distinct modes of operation.

In one embodiment, for example, an exemplary interface device may be configured to support a field device operating in a 4-20 mA input mode. Field device 1a may be configured to transmit a 4-20 mA input signal current to the control side. Furthermore, field device 1a may also be configured to receive and/or transmit FSK-modulated signals. As configured, field device 1a may be used with interface device 100 (see FIG. 1 and FIG. 2).

In one embodiment, where the power supply of field device 1a is external to interface device 100, current is sourced into terminal 4a by field device 1a, thus creating a positive current flow. The current follows a path defined by elements 8, 13, and terminal 5a (FIG. 2). In an alternate embodiment, where the power supply is provided by terminals 2 and 3, the current follows a path defined by elements 8, 13, and 14.

In either case, field device 1a may transmit an input current ranging from DC (substantially 0 Hertz) to several Hertz in frequency, the input current having superimposed thereon an FSK current modulation if field device 1*a* is HART-enabled and is transmitting. At times defined by the HART protocol, field device 1*a* FSK modulates the terminal voltage to transmit signals. Second section 100*b* is configured to preserve and extract both the DC process signal and the FSK signals, and subsequently, second section 100*b* may transmit both signal components to controllers on the control side.

In yet another embodiment, an exemplary interface device may be configured to support a field device operating in a 4-20 mA output mode. Field device 1*a* may be configured to receive a 4-20 mA output signal from the control side. Field device 1*a* may also be configured to transmit FSK-modulated signals. As configured, field device 1*a* may be used with interface device 100.

In this embodiment, DAC 20 may use either field power from terminals 2 and 3 or isolated power supply 30 to regulate a current into the field loop and source it to field device 1*a*. First section 100*a* may be used to control the current signal, and second section 100*b* may be used to form the 4-20 mA current in the field loop.

The serial output originating from the control side may have two components. The first component may be a digital output value which arrives at DAC 20 and is converted to a buffered voltage reference into summing junction 19. Generally speaking, summing junction 19 is a summing circuit configured to superimpose the output signal of the DAC with a second signal component. The second component may be FSK/HART data which arrives at Tx UART 24 and is dispensed one binary value of 0 or 1 at a time to the modulator 23.

Modulator 23 translates the binary value at first to a continuous phase FSK signal, and subsequently, to a modulated bit stream. LPF 18 removes the clock modulation introduced by modulator 23, thus leaving the desired analog voltage signal into summing junction 19. The two components are summed and the resulting signal controls the current source 11*a*. As such, current source 11*a* is active, and the output signal current is flowing to the loop that includes elements 11*a*, 7, 8, 4*a*, 1, 5*a*, and 14.

In some embodiments, an exemplary interface device may be configured to support a field device operating in a thermocouple input mode. Field device 1*a* may be a thermocouple device that provides an input signal to interface device 100. In that case, field device 1*a* is a two-wire thermocouple which develops a bipolar voltage potential by the Seebeck effect. The bipolar voltage may be sensed and linearized by interface device 100 to determine the thermocouple junction temperature.

In this mode, DAC 20, elements 11*a*, and 19 are disabled. VM 13 is also disabled and in high impedance mode. DAC 20 may be isolated to minimize leakage currents. The bipolar voltage from field device 1*a* is transmitted from terminals 4*a* and 5*a*, and overcomes the high impedance bias supplies 9 and 10. The bipolar voltage thus appears at inputs 15*b* and 15*d* of MUX 15.

The gain of PGA 16 may be set to a pre-determined level depending on the type of thermocouple connected to interface device 100. This thermocouple type may be provided as a configuration setting via signals originating from controllers on the control side. The output of PGA 16 is fed to ADC 17, at which point interface device 100 operates in the same manner as discussed above.

One or more exemplary interface devices may be configured to support a field device operating in a RTD 3-wire mode. Field device may be a three-wire RTD. In these embodiments, more than one interface device may be used.

As shown in FIG. 3, interface devices 100 and 200 accommodate a three-wire RTD device (field device 1*b*) connected to terminals 4*a*, 5*a*, and 5*b*. While interface device 200 is not shown in its entirety, one of ordinary skill in the art will readily recognize that interface device 200 is an instance of interface device 100, i.e. that the two interface devices have substantially the same architectures.

Field device 1*b* may be configured to transmit two equal excitation currents (each on the order of 0.1 mA to 1 mA) to interface devices 100 and 200 to develop a unipolar voltage across the terminals of field device 1*b*. Field device 1*b* senses the developed voltage to compensate for wire resistance to eliminate measurement errors. As such, the RTD three-wire mode is both an output and input mode.

DAC 20 uses either field power from terminals 2 and 3 or isolated power supply 30 to regulate a current into field device 1*b*. For a three-wire mode, interface devices 100 and 200 cooperatively function to control current signals, form current signals, and sense the RTD voltage.

A first current signal may be created in two possible ways. In one embodiment, the current value may be controlled by a controller on the control side. In another embodiment, the first current may be a fixed value created by constant current source like current source 11*a*.

When the first current originates from the control side, the serial output of the controller may include a digital output value which arrives at DAC 20 (in interface device 100). The digital output value is converted to a buffered voltage reference into summing junction 19, with the second component input of summing 19 junction being null. The two components are summed and the resulting signal controls current source 11*a*. Alternatively, a fixed current source in second section 200*b* becomes enabled, and creates the desired constant current.

In either embodiment the current source of the field device 1*b* is regulated to match the current of source 11*a* and its counterpart located in interface device 200. The regulator may be a current mirror or a current splitter (not shown in FIG. 3).

The first current flows through a loop including elements 11*a*, 7 (or the current source of interface device 200) and elements 8, 4*a*, 1, 5*b* and 14*b*. The second current (i.e. the current from field device 1*b*) flows through a loop including the current source of interface device 200, node 5*a*, the 5*a*/5*b* branch, node 5*b* and switch 14*b*. While FIG. 3 depicts two interface devices, terminal 5*b* may also be a terminal dedicated to interface device 100.

That is, terminal 5*b* is either connected to the circuit common by switch 14*b* of interface device 200, or it may be connected directly to the circuit common. In either case, the first current flows through terminal 4*a* and the second current flows through terminal 5*a*. The currents combine at field device 1*b*, the junction of wires 5*a* and 5*b*, and the sum of the currents returns via terminal 5*b*, either using the switch 14*b* to shunt it to the circuit common, or simply to terminal 5*b* via interface device 200.

The voltage transmitted from field device 1*b* to terminals 4*a* and 5*a* equals the voltage across field device 1*b* because of the matched first and second currents flowing through equal lengths of first and second wires. As such, error components of the voltage caused by the field wire resistance cancel. The voltage transmitted from field device 1*b* to terminals 4*a* and 5*a* overcomes the high impedance bias supplies 9 and 10. The device voltage appears at inputs 15*a* and 15*d* of MUX 15. The gain of PGA 16 is set appropriately for the signal level that depends on the type of RTD which is connected. As before, the RTD type may be a configuration setting that is provided by the controller/processor. The output of PGA 16 is fed to ADC 17, at which point interface device 100 operates in the same manner as discussed above.

In some embodiments, one or more exemplary interface devices may be configured to support a field device operating in an RTD four-wire mode. Field device may be a four-wire RTD with a Kelvin connection. In these embodiments, more than one interface device may be used.

As shown in FIG. 4, interface devices 100 and 200 accommodate a four-wire RTD device (field device 1*c*) connected to terminals 4*a*, 5*a*, 4*b*, and 5*b*. While interface device 200 is not shown in its entirety, one of ordinary skill in the art will readily recognize that interface device 200 is an instance of interface device 100, i.e. that the two interface devices have substantially the same architectures.

In these embodiment, interface device 100 transmits an excitation current (on the order of 0.1 mA to 1 mA) to field device 1*c* to develop a unipolar voltage across the device. Interface device 200 senses the voltage across field device 1*c*, eliminating the need for wire compensation due to the Kelvin connection. As such, the RTD four-wire mode is an output and an input mode.

DAC 20 uses either field power from terminals 2 and 3 or isolated power from power supply 30 to regulate a current output signal to field device 1*c*. Interface devices 100 and 200 form and control the current signal, source it to field device 1*c*, and sense the RTD voltage.

A first current signal may be created in two possible ways. In one embodiment, the current value may be controlled by a controller on the control side. In another embodiment, the first current may be a fixed value created by constant current, such as current source 11*a*.

When the first current originates from the control side, the serial output of the controller may include a digital output value which arrives at DAC 20 (in interface device 100) and is converted to a buffered voltage reference into summing junction 19, the second component input of summing 19 junction being null. The two components are summed and the resulting signal controls current source 11*a*. Alternatively, a fixed current source in second section 200*b* becomes enabled, creating the desired constant current.

In either embodiment, the current source of the field device 1*b* is regulated to match the current of source 11*a*. The regulator may be a current mirror or a current splitter (not shown in FIG. 4).

When current source 11*a* or the current source of interface device 200 is active, the current flows through a loop including elements 11*a*, 7 (or the current source of interface device 200), and elements 8, 4*a*, 1, 5*a*, and 14. While FIG. 4 depicts two interface devices being used, in some embodiments, terminals 4*b* and 5*b* may be terminals dedicated to interface device 100. In either case, the first current flows through field wire of 4*a* and 5*a*, and no current flows through the field wires of 4*b* and 5*b*.

Because of the Kelvin connection, the unipolar voltage transmitted from field device 1*c* to terminals 4*b* and 5*b* equals the voltage across the device. The voltage transmitted from field device 1*c* to terminals 4*a* and 5*a* overcomes the high impedance bias supplies 9 and 10. The device voltage appears at inputs 15*a* and 15*d* of MUX 15. The gain of PGA 16 is set appropriately for the signal level that depends on the type of RTD which is connected. The RTD type is a configuration setting that provided by the controller/processor. The output of PGA 16 is provided to ADC 17, at which point interface device 100 operates in the same manner as discussed above with respect to processing input signals.

In some embodiments, an interface device may be configured to support a field device operating in a voltage input mode. A field device may simply provide a voltage input signal. The input signal may be a unipolar or a bipolar voltage, and may be transmitted from terminals 4*a* and 5*a* (considering FIGS. 1 and 2) to overcome the high impedance bias supplies 9 and 10. As such, the voltage appears at inputs 15*a* and 15*d* of MUX 15. The gain of PGA 16 is set appropriately for a signal level responsive to the voltage output range of the field device. The voltage output range is a setting that may be provided by the controller/processor. The output of PGA 16 is provided to ADC 17, at which point interface device 100 operates in the manner as discussed above.

In some embodiments, an interface device may be configured to support a field device operating in a voltage output mode. A field device may be configured to receive either a unipolar voltage signal or a unipolar bipolar voltage signal. As configured, interface devices according to the present disclosure may be used to output the desired voltage signal to the field device.

In such an embodiment, considering FIGS. 1 and 2 again, DAC 20 may use isolated power 30 to transmit a voltage signal to field device 1*a*. First section 100*a* and second section 100*b* may cooperatively function to accomplish this task.

In first section 100*a*, DAC 20 converts a serial output of the controller/processor to a buffered voltage that is relayed by switch 12*d*. On the other hand, in second section 100*b*, switches 12*d* and 14 are closed. The buffered voltage is impressed across terminals 4*a*, and 5*a*. Assuming field device 1*a* is connected properly, the sense current needed to sense the commanded voltage will flow through the field loop from terminal 4*a* and return to terminal 5*a*.

In one embodiment, an interface device may be configured to support a field device operating in a discrete level input mode of operation. A field device interfaced with interface device 100 may be a 24V wetted contact that can apply 24V or 0V discrete levels to interface device 100. When the contact is closed, the 24V input signal appears at terminal 4*a* in FIG. 1. In this mode, current sink 6 is controlled by the voltage from DAC 20 to sink a current having magnitude in the range of 1 mA to 10 mA.

The current exits at terminal 5*a* and returns to the field supply which wetted the contact. A voltage is developed across current sink 6 that depends on the sunk current. This voltage is sensed as it appears at inputs 15*c* and 15*d* of MUX 15. The gain of PGA 16 is set appropriately for the signal level from the sink. The output of PGA 16 is fed to ADC 17, at which point interface device 100 operates in the manner as discussed above.

In yet another embodiment, a discrete level output mode may be provided. A field device may receive either 24V or 0V discrete levels from interface device 100 in FIG. 1. For convenience, these levels will be referred to below as "ON" or "OFF", the "ON" state corresponding to the 24V level and the "OFF" to the 0V level.

In this embodiment, DAC 20 may use either field power (from terminals 2 and 3) or isolated power (from power supply 30). First section 100*a* and second section 100*b* may cooperatively function to output ON or OFF signals to field device 1*a*.

The serial output of the controller/processor includes a digital output value set to either a maximum reference or a zero reference, corresponding to ON or OFF states, which arrives at DAC 20 and is converted to a buffered voltage reference into summing junction 19. The second input into summing junction 19 is null. The reference, when set to the maximum value, will cause current source 11a to increase its output voltage until the maximum current is attained or the compliance voltage limit of DAC 20 is reached.

Thus in the ON state, there is a current-limited and voltage-limited output signal. The reference, when set to minimum value (zero), will cause current source 11a to decrease its voltage and current output to zero. Thus in the OFF state, the output signal is at 0V. These discrete states are effectively the two compliance rails of DAC 20, which may be 24V and the circuit common (0V). It is noted that the present disclosure is not limited to these compliance rail values; other values for the compliance rails may also be used, depending on the DAC design employed.

Following the processing by DAC 20, current source 11a is active. This creates a current that flows through a loop that includes elements 11a, 12a, 7, 8, 4a, 1, 5a, and 14.

Having set forth the various modes of operation of interface device 100 (and 200), DCS 500 wherein a plurality of interface devices is used is discussed below with respect to FIG. 5. In this illustrative embodiment, the interface devices may be similar in architecture to those discussed previously with respect to FIGS. 1-4.

Further, while only interface devices 100, 200, and 300 are shown in FIG. 5, one of skill in the art will readily appreciate that more than three interface devices may be used in distributed control system 500. Furthermore, distributed control system 500 may be configured to interface with more field devices than those shown (1d, 1e, and 1f).

Moreover, while interface devices 100, 200, and 300 are shown to be connected directly to controller 50a, 50b, and 50c, respectively, one of skill in the art will readily appreciate that controllers 50a-50c may be interfaced statically or dynamically with any interface device included in distributed control system 500. Controllers 50a-50c may each have a plurality of channels. Further, distributed control system 500 may include at least one computer processor configured to control interface device 100, 200, and 300.

First sections 100a, 200a, and 300a may be configured to receive a first set of signals from field devices 1d, 1e, and 1f. The first set of signals can include output signals, i.e. signals originating from controllers 50a-50c. The first set of signals may be either analog or digital voltage or current signals. While a particular connection pattern is shown for field devices 1d, 1e, and 1f, one of ordinary skill in the art will readily understand that arbitrary connection patterns to any interface circuits included in distributed control system 500 may be achieved. Connection patterns may be static or dynamic, the latter being implemented using one or more programmable logic devices, for example. Alternatively, field devices 1d, 1e, and 1f may be connected to a field loop communicatively coupled to first sections 100a, 200a, and 300a.

Distributed control system 500 may also be configured to transmit a second set of signals to controllers 50a-50c, or to the field loop. The second set of signals being analog or digital voltage or current signals. Moreover, distributed control system 500 may be configured to modulate a third set of signals originating from the field loop, the third set of signals being analog or digital voltage or current signals. In addition, distributed control system 500 may be configured to demodulate a fourth set of signals originating from the field loop. The fourth set of signals may be either analog or digital voltage or current signals. And the fourth set of signals may be signals that are modulated according to an FSK protocol.

In other embodiments, FIG. 5 may be a distributed interface device 500 that includes a plurality of field circuits (100b, 200b, 300b, for example). The field circuits may be configured to communicate with a plurality of field devices (1d, 1e, 1f, for example) operating in distinct modes. Distributed interface device 500 may include a plurality of control circuits (100a, 200a, 300a, for example). The control circuits may be configured to transmit control signals to the field devices through the field circuits using formats associated with the distinct modes of the field circuits. Furthermore, in some embodiments, the distinct modes may include at least one mode associated with signals being modulated based on FSK protocol, namely a HART protocol.

One or more of the disclosed universal I/O interfaces may be used to perform a distributed control method. An illustrative embodiment of such a method is shown in FIG. 6. Specifically, method 600 may be used for interfacing a distributed interface device with a plurality of field devices coupled to a field loop. The distributed interface device may a plurality of interface devices such as the ones discussed above with respect to FIGS. 1-5.

Method 600 may include receiving an analog signal (step 1000) from at least one field device from among the plurality of field devices, the analog signal including a process signal and a modulated control signal. The method may include converting (step 2000), by the distributed interface device, the analog signal into a digital signal that includes a digital process signal and digital modulated signal, wherein the digital modulated signal is modulated according to an FSK protocol like the HART protocol discussed previously.

The method may further include processing the digital signal (step 3000), by the distributed interface device, to extract information associated with the at least one field device. Furthermore, method 600 may include transmitting (step 4000) to the field loop, by the distributed interface device and based on the extracted information, a set of control signals, the set of control signals being analog or digital voltage or current signals, and wherein at least one signal from the set of control signals is modulated according to the FSK protocol.

Alternative embodiments, examples, and modifications which would still be encompassed by the present disclosure may be made by those skilled in the art, particularly in light of the foregoing teachings. Further, it should be understood that the terminology used to describe the disclosure is intended to be descriptive rather than limiting. Those skilled in the relevant art(s) will also appreciate that various adaptations and modifications of the embodiments described above can be implemented without departing from the scope and spirit of the disclosure. Therefore, it is to be understood that, within the scope of the appended claims, the disclosure may be practiced other than as specifically described herein.

What is claimed is:

1. A programmable device for interfacing with a field device, the circuit comprising:
   a converter module configured to operate as only one of an analog-to-digital converter (ADC) and a digital-to-analog converter (DAC);
   wherein when the converter module operates as an ADC, the ADC is configured to (i) receive, from the field device, one from the group including a first current signal and a first voltage signal, the received one signal having frequency shift keying tones (FSK) superimposed thereon and (ii) extract information from the received one signal and the FSK tones simultaneously; and wherein when the converter module operates as a DAC, the DAC is configured to drive an output signal to the field device, the output signal (i) including one from the group including a second current signal and a second voltage signal and (ii) being summed with an FSK-modulated signal.

2. The circuit of claim 1, wherein the FSK tones are representative of a Highway Addressable Remote Transfer (HART) signal.

3. The circuit of claim 1, wherein the FSK-modulated signal is a Highway Addressable Remote Transfer (HART) signal.

4. The circuit of claim 1, wherein the field device is a resistance temperature detector (RTD).

5. The circuit of claim 1, wherein the field device is a thermocouple.

6. The circuit of claim 1, wherein the received one signal is selected from the group including 4-20 mA current signals, 0-5 Volt unipolar signals, 0-10 Volt unipolar signal, +/−5 Volt bipolar, and +/−10 Volt bipolar voltage signals.

7. The circuit of claim 1, wherein the output signal is selected from the group consisting of 4-20 mA current signals, 0-5 Volt unipolar signals, 0-10 Volt unipolar signal, +/−5 Volt bipolar, and +/−10 Volt bipolar voltage signals.

* * * * *